United States Patent [19]
Raschke

[11] Patent Number: 6,047,832
[45] Date of Patent: Apr. 11, 2000

[54] COMPONENT CARRIER TAPE

[75] Inventor: Russ V. Raschke, Minnetonka, Minn.

[73] Assignee: Advantek, Inc., Minnetonka, Minn.

[21] Appl. No.: 09/373,554

[22] Filed: Aug. 13, 1999

[51] Int. Cl.$^7$ .................................................. B65D 85/90
[52] U.S. Cl. ........................................................... 206/714
[58] Field of Search ................................... 206/454, 701, 206/713, 714, 715, 716, 724, 725

[56]         References Cited

U.S. PATENT DOCUMENTS

| | | |
|---|---|---|
| 5,026,303 | 6/1991 | Matsouka et al. . |
| 5,152,393 | 10/1992 | Chenoweth . |
| 5,259,500 | 11/1993 | Alvite et al. . |
| 5,351,821 | 10/1994 | Skrtic ...................................... 206/714 |
| 5,361,901 | 11/1994 | Schenz et al. .......................... 206/714 |
| 5,472,085 | 12/1995 | Gelzer . |
| 5,727,688 | 3/1998 | Ishii et al. ............................... 206/724 |
| 5,960,961 | 10/1999 | Gutentag ................................. 206/714 |

*Primary Examiner*—Jim Foster
*Attorney, Agent, or Firm*—Burd, Bartz & Gutenkauf

[57]         ABSTRACT

A tape having a plurality of pockets for accommodating electronic components has a bottom wall with platforms for supporting electronic components and end walls having bosses adjacent opposite ends of tape and side walls adjacent opposite sides of the tape to prevent lateral, longitudinal, and rotational movements of the electronic components in the pockets. Fingers on the bosses and/or side walls extend over opposite portions of the electronic components to vertically retain the electronic components in the pockets.

39 Claims, 11 Drawing Sheets

COMPONENT CARRIER TAPE

TECHNICAL FIELD

The invention relates to elongated tapes having pockets for storing electric components in two positions. The tape storing the components is wound on reels and transported from a component manufacturer to a different manufacturer that assembles the components into products.

BACKGROUND OF THE INVENTION

Conventional carrier tapes for storing electronic components have an elongated strip of plastic having a series of identical pockets. The pockets have sizes and shapes to accommodate specific designs of electronic components, such as microchips. The electronic components are supported in only one position on shoulders and corner supports extended upwardly from the wall at the bottom of the pocket. Ridges on the bottom wall cooperate with the sides of the electronic components prevent lateral movements of the electronic components. The ridges, shoulders and corner supports position the electronic components in the pockets and maintain the leads in spaced relationship relative to the bottom and side walls of the tape to protect the leads. A continuous cover tape-attached to the top of the tape retains the electronic components in the pockets. This cover tape must be removed from the tape to allow the electronic components to be removed from the tape. An example of a microchip storage tape with a cover tape to retain microchips in pockets in the tape is described by D. B. Chenoweth in U.S. Pat. No. 5,152,393.

SUMMARY OF THE INVENTION

The invention is a tape for holding electronic components, such as components having information display windows, microchips and connectors having leads adopted to be connected to electronic circuits. The electric components are retained in pockets in the tape that conform to the sizes and shapes of the electronic components. The tape is an elongated plastic strip member having longitudinally spaced pockets for accommodating electronic components. The strip member has longitudinal end walls, transverse side walls, and a bottom wall joined to the side and end walls surrounding each pocket and providing the pocket with an open top and generally rectangular shape. The bottom wall has at least one elevated platform to locate the component and connector thereon above the bottom wall so that the electronic component and connector do not contact the bottom wall. The bottom wall can have a flat surface to support an electronic component in the pocket. The opposite end walls have inwardly directed bosses that transversely locate the component in the pocket. The side walls have wall portions that engage the component to longitudinally locate the component in the pocket. The component is held on the bottom wall or platform with fingers extended inwardly into the pockets. The fingers are projections on the end or side walls, or both the end and side walls that engage top portions of the component to hold the electronic component in the pocket. The vertical space between the fingers and platform is smaller than the thickness of the electronic component whereby the fingers bias the electronic component into surface engagement with the top of the platform and addition structure that supports the electronic component in the pocket.

One embodiment of the tape accommodates electronic components having connectors offset from the center of one side edge of the component. One side wall has recesses for accommodating the connectors of the different electronic components. The recesses are open to the pocket and are transversely spaced from each other so that when one component is in the pocket the connector is located in one recess and when the other component is in the pocket the connector is located in the other recess. The bosses on the side walls are located generally in the middle of the side walls and are transversely aligned with each other. The bosses have upright walls that contact opposite end edges of the component to transversely locate the component in the pocket. The fingers are inwardly directed projections on the upright walls of the bosses that engage opposite top portions of the components to hold the components firmly on the platforms in the central portion of the bottom wall and corners of the pockets. A cover tape is not used to retain the components in the pockets.

The objects and advantages of the tapes of the invention will be readily apparent from the following detailed description and the accompanying drawings.

DESCRIPTION OF THE PREFERRED EMBODIMENT OF THE CARRIER TAPE

Figure 1:
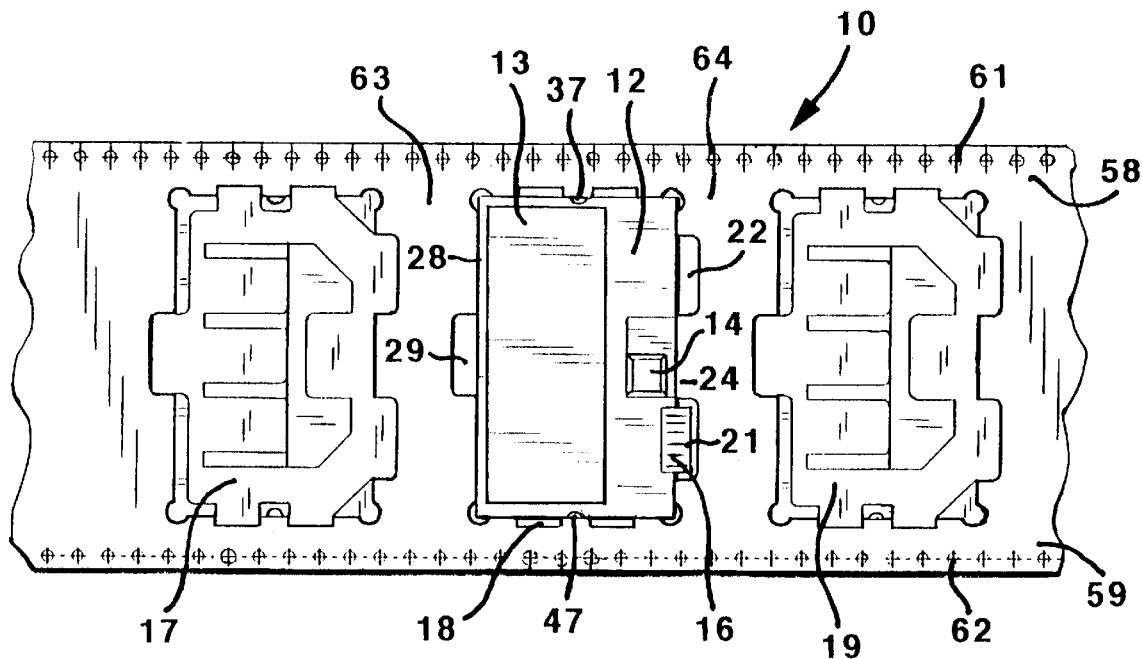
FIG. 1 is a top plan view of the component carrier tape holding an electronic component in a first position.
Figure 2:
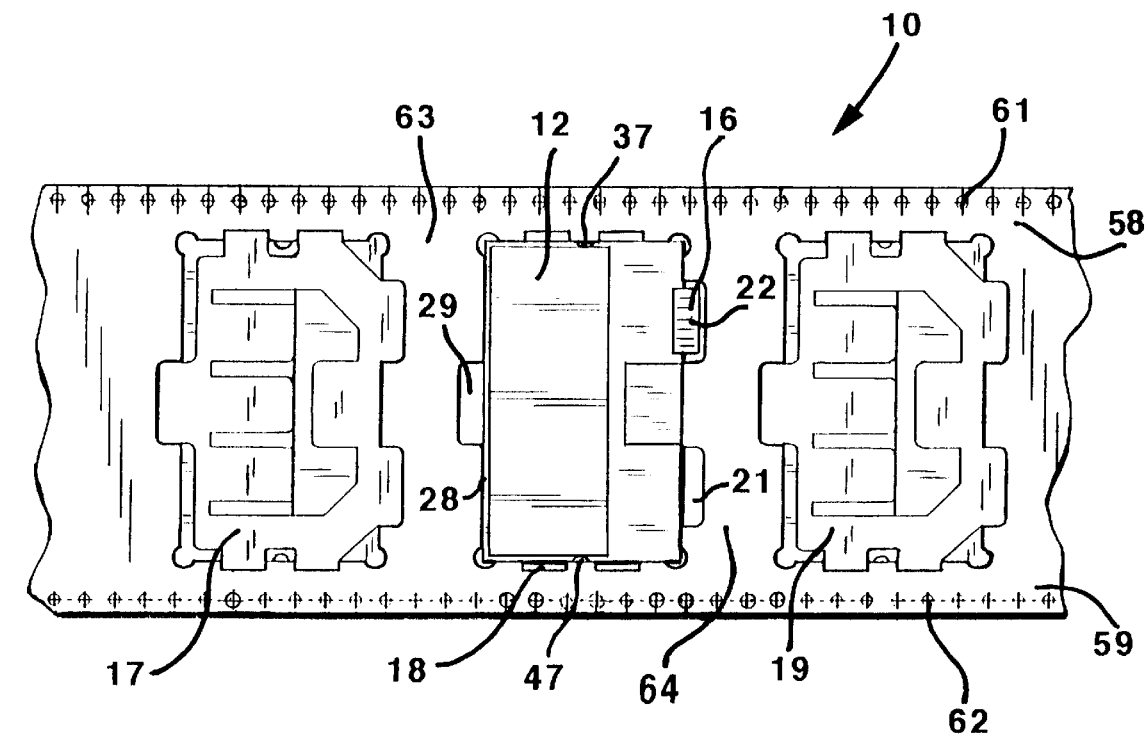
FIG. 2 is a top plan view of the tape of FIG. 1 holding another electronic component.

Referring to FIGS. 1 and 2, there is shown an elongated flexible tape of the invention, indicated generally at 10, for holding electronic components 11. Tape 10 is an elongated flexible plastic ribbon or strip member that can be wound on a reel to store and transport the electronic components. An example of a reel assembly for accommodating a component carrier tape is disclosed by D. B. Chenoweth in U.S. Pat. No. 4,726,534. Tape 10 is a plastic strip of PVC or polystyrene plastic formed with a plurality of generally rectangular downwardly directed pockets for accommodating electronic components. Other types of plastic can be used to make tape 10.

Electronic component 11 has a flat base 12 supporting a general rectangular panel 13, a microchip or processor 14 and an electrical connector 16 having a plurality of leads adopted to be coupled to electronic circuits of a product. Connector 16 projects outwardly from one side of base 12 offset from the center thereof so as to expose the leads. The electronic component is part of a communication identification display box or a visual information panel on a telephone. Other types of electronic components and parts can be retained on the tape according to the use of the novel structure of the tape.

Tape 10 has a plurality of longitudinally spaced pockets for accommodating electronic components. Three pockets 17, 18 and 19 are shown in FIGS. 1 and 2. Tape 10 has additional pockets along the length of the tape. The portion of tape 10 having pockets 17 and 18 is herein described in detail. The remaining pockets have the same structure and size as pockets 17 and 18.

Figure 8:
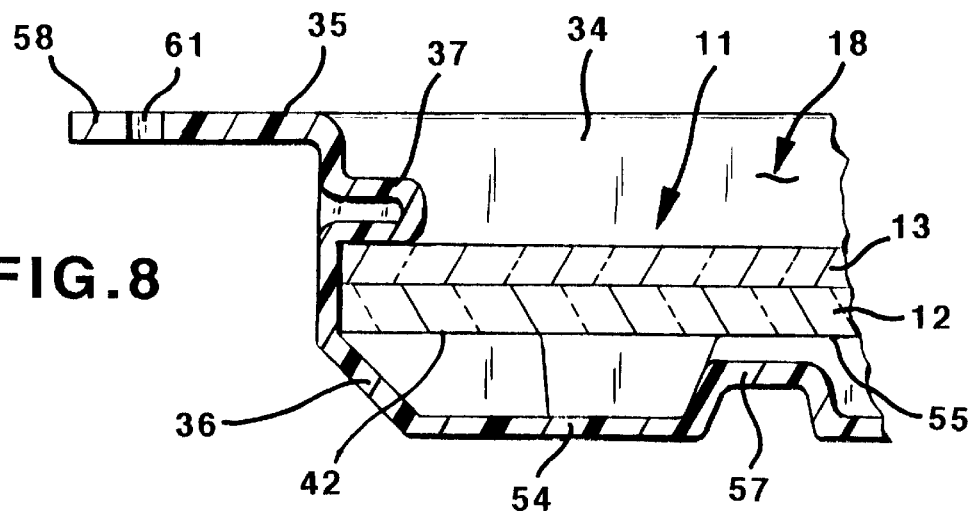
FIG. 8 is an enlarged sectional view of the left end of FIG. 5.

Tape 10 has a first transverse upright side wall 23 having a pair of longitudinal outwardly directed rectangular recesses 21 and 22 for accommodating connector 16 and preventing the leads on connector 16 from contacting wall 23. The central portion of wall 23 has a boss 24 transversely aligned with transverse platforms or shoulders 26 and 27 located at opposite ends of wall 23. A second transverse side wall 28 longitudinally spaced from wall 23 has a central rectangular recess 29 and flat horizontal platforms or ledges 31 and 32 extended to rounded corners 33 and 53. Ledges 31 and 32 have linear flat top surfaces that support one end of electronic components 11 in pocket 18. The opposite end of electronic component 11 is supported on corner platforms 42 and 48 located adjacent pocket corners 41 and 49. Tape 10 has a first longitudinal end wall 34 having an inwardly directed central boss 35. The upright inside wall of boss 35 has a lower wall portion 36 inclined downwardly and inwardly to a bottom wall 54 and an inwardly directed projection or finger 37 located above portion 36, as shown in FIG. 8. The upright distance between finger 37 and the top of lower portion 36 is less than the thickness of electronic component 11. The inclined wall portion 36 wedges electronic component 11 up against finger 37 to limit vertical movement of electronic component 11 in pocket 18. Opposite ends of wall 34 have upright shoulders 38 and 39 longitudinally aligned with the inside wall of boss 35 adapted to engage opposite ends of a side of electronic component 11 to prevent yawing of component part 11 in pocket 18. Finger 37 biases electronic component downward in pocket 18. A second longitudinal end wall 43 parallel to wall 34 has an inwardly directed boss 44 transversely aligned with boss 35. Boss 44 has a lower wall portion 46 inclined inwardly and downwardly to bottom wall 54 and an inwardly directed projection or finger 47. Boss 44, lower wall portion 46, and finger 47 is the mirror image structure as shown in FIG. 8. Upright shoulders 51 and 52 on opposite longitudinal ends of wall 43 cooperate with shoulders 38 and 39 on wall 34 to maintain the transverse position of electronic part 11 in pocket 18 and prevent yawing of electronic part 11 of pocket 18.

Figure 3:
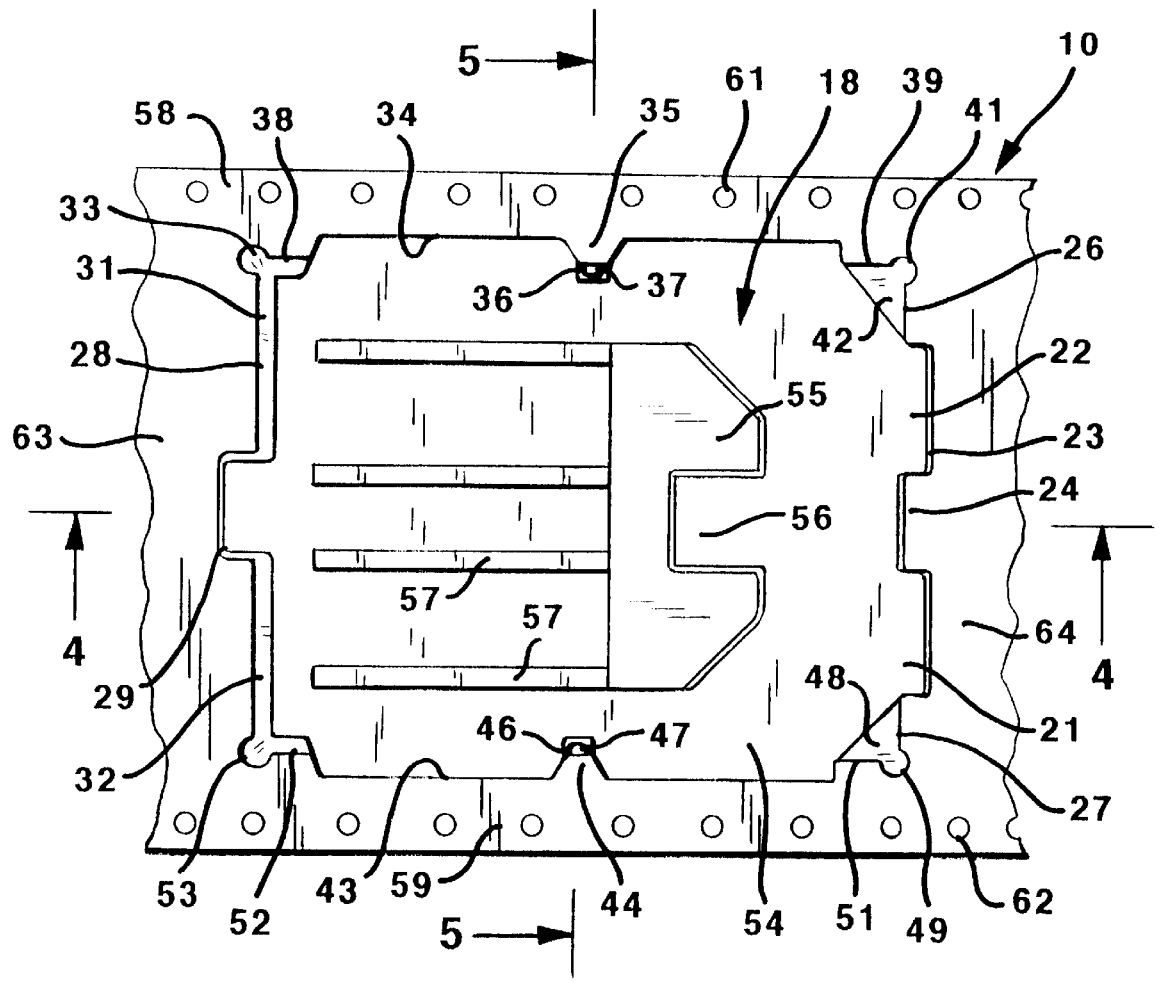
FIG. 3 is an enlarged top plan view of a section of the tape of FIG. 1.
Figure 4:
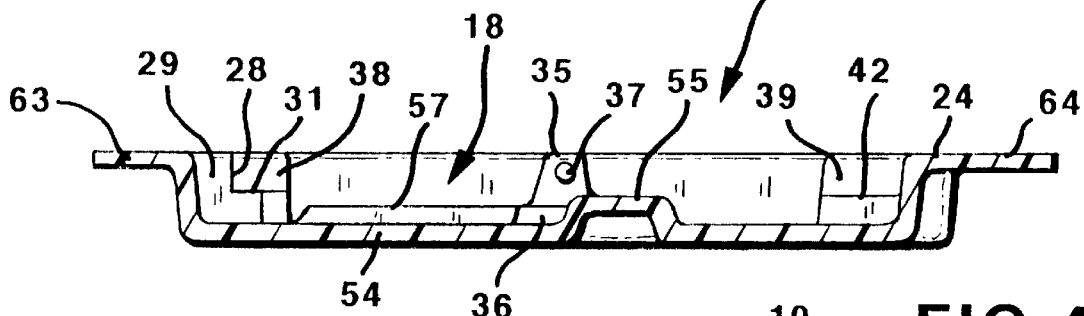
FIG. 4 is a sectional view taken along line 4—4 of FIG. 3.

The side walls 23 and 28 and end walls 34 and 43 are joined to bottom wall 54. As shown in FIG. 3, wall 54 has an elevated platform 55 having a square recess 56 facing boss 24. A plurality of longitudinal upright ribs 57 in wall 54 extended from platform 55 toward end wall 28. Platform 55 has a flat top surface that provides a surface support for electronic component 11 and transversely reinforces wall 54. Ribs 57 longitudinally reinforce wall 54.

Figure 5:
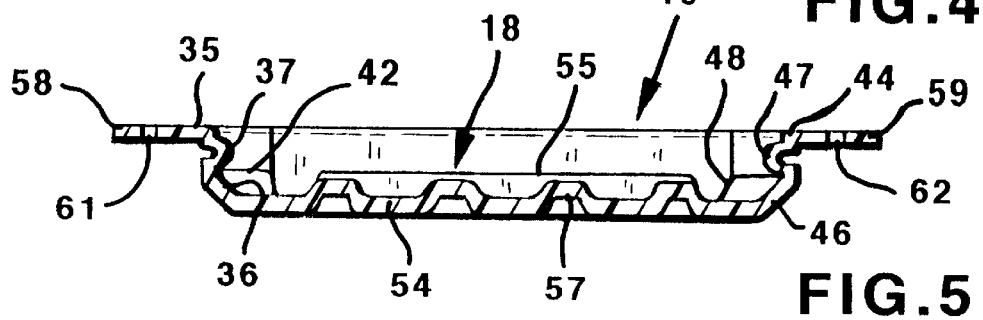
FIG. 5 is a sectional view taken along line 5—5 of FIG. 3.

Returning to FIGS. 3 and 5, tape 10 has longitudinal side flanges 58 and 59 extended outwardly from opposite sides of the pockets along the length of the tape. Side flanges 58 and 59 have a plurality of longitudinally spaced holes 61 and 62 adapted to accommodate drive sprocket 5 or other means used to move the tape relative to component loading and unloading equipment. Tape 10 has transverse flat bridges 63 and 64 between adjacent pockets 17, 18 and 18, 19. Additional bridges are located between adjacent pockets along the length of tape 10. Flanges 58 and 59 and bridges 63 and 64 are located in the same horizontal plane that transverses the top of pockets 17, 18 and 19.

Figure 6:
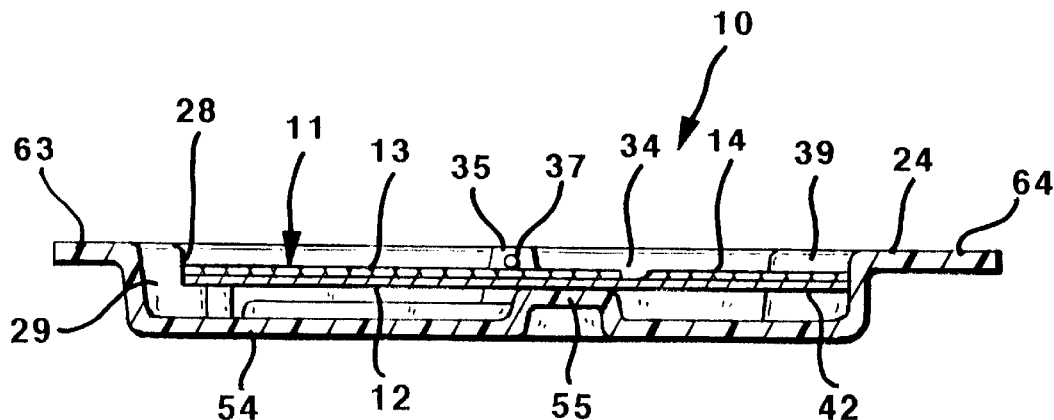
FIG. 6 is a sectional view similar to FIG. 4 retaining an electronic component.
Figure 7:
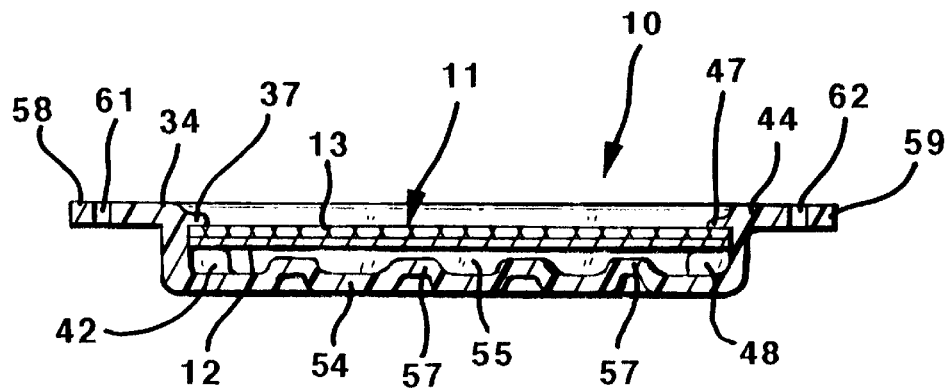
FIG. 7 is a sectional view similar to FIG. 5 retaining an electronic component.

As shown in FIGS. 6 to 8, electronic component 11 is supported on platform 55, ledges 31 and 32, and corner platforms 42 and 48. Platform 55 supports the central portion of electronic component 11 and ledges 31 and 32 and corner platforms 42 and 48 support the four corners of electronic component 11 above bottom wall 54. The leads of connector 16 are also located above bottom wall 54 and spaced from end wall 23 to prevent contact of the leads with tape 10. Fingers 37 and 47 extend over opposite side portions of electronic component 11 to hold component 11 on support platforms 42, 48 and 55 and ledges 31 and 32. As shown in FIG. 8, the distance between the bottom of finger 37 and the top of platform 42 is less than the thickness of electronic component 11 so that fingers 37 and 47 firmly hold electronic component 11 in pocket 18. A cover tape is not used to retain electronic part 11 in pocket 18. Side walls 34 and 43 are flexed outwardly to release fingers 37 and 47 from electronic component 11 to allow the component to be removed from tape 10. One side of tape 10 can be bent or flexed outwardly to release a finger from the component. This releases the component so it can be removed from the pocket 18. Alternatively, opposite sides of tape 10 can be bent or flexed outwardly in opposite directions to release both fingers 37 and 47 from the component 11. The component 11 can be lifted from pocket 18 with automatic equipment and moved to a desired location. Alternative shapes of electronic components can be retained in pockets 17 and 18 as shown in FIGS. 1 and 2. Connector 16 is located in either recess 21 or 22 when electronic component 11 is in pocket 18. Components without projecting connectors can be retained with fingers 37 and 47 in pockets 17 and 18.

A first modification of the electronic component carrier tape, indicated generally at 100, is illustrated in FIGS. 9 to 14. Tape 100 is an elongated flexible plastic ribbon or strip member used to hold electronic components 111, such as microchips. Polyvinylchloride or polystyrene plastic are materials suitable for tape 100. After the electronic components have been placed on the tape, the tape is wound on a reel assembly. The reel assembly accommodating the tape and electronic components is transported to a desired location.

Figure 12:
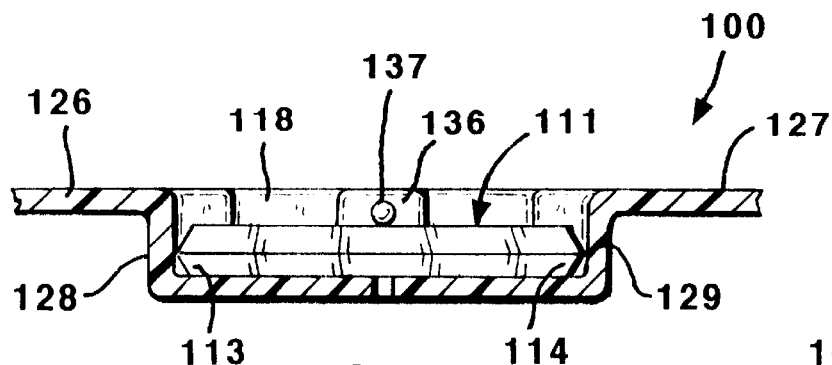
FIG. 12 is an enlarged sectional view taken along line 12—12 of FIG. 9.
Figure 13:
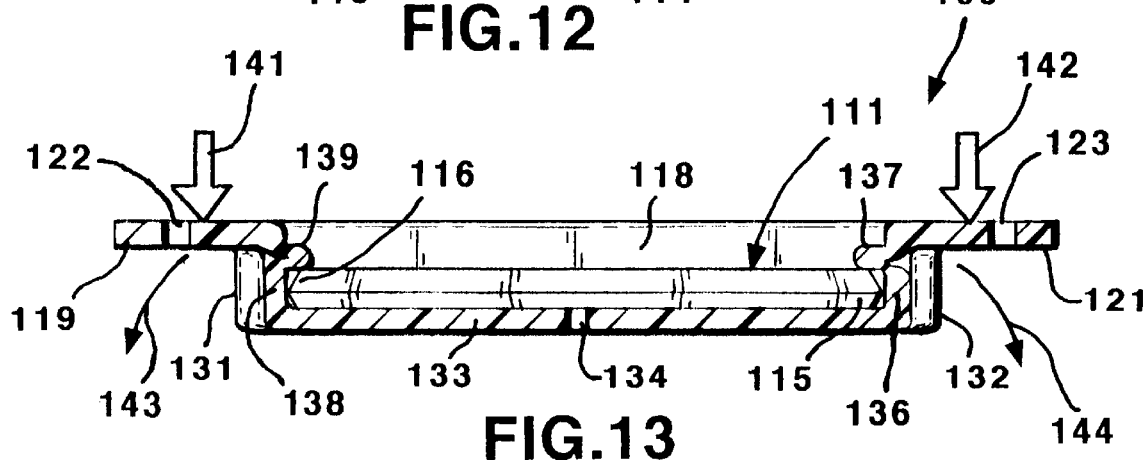
FIG. 13 is an enlarged sectional view taken along line 13—13 of FIG. 9.
Figure 14:
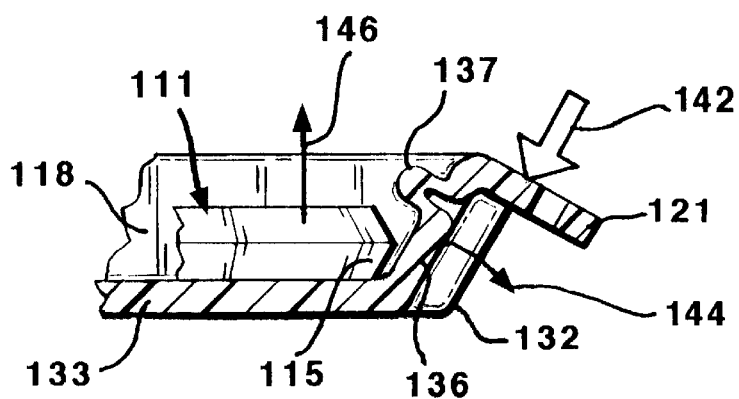
FIG. 14 is an enlarged sectional view of an edge section of the tape of FIG. 9 flexed to the component release position.

Electronic component 111 is shown as a generally flat rectangular member 112 having linear opposite side 113 and 114 and linear opposite ends 115 and 116. As shown in FIGS. 12 to 14, electronic component has flat upper and lower surfaces. The lower surface rests on the bottom wall 133 of a pocket 118 formed in tape 100. Bottom wall 133 can have a platform to support component 111.

Other styles of electronic components can be carried by tape 100. Tape 100 has a plurality of longitudinally spaced pockets or recesses 117 and 118 shaped to accommodate the shape of the electronic components that are to be carried by the tape. Pockets 117 and 118 have generally rectangular shapes to allow the rectangular electronic components to fit in the pockets. Additional pockets are located along the length of the tape. The portion of tape 100 having pockets 117 and 118 is herein described. The portion of tape 100 having additional pockets has the same structure and size as pockets 117 and 118.

Tape 100 has linear longitudinal side flanges 119 and 121 having rows of holes 122 and 123 adapted to receive drive sprockets or other means used to move the tape relative to electronic components loading and unloading equipment. Adjacent pockets 117 and 118 are longitudinally separated with transverse bridges 124, 126 and 127. Additional bridges are located along the tape separating adjacent pockets. The flanges 119 and 121 and bridges 124, 126 and 127 are located in the same horizontal plane.

Figure 9:
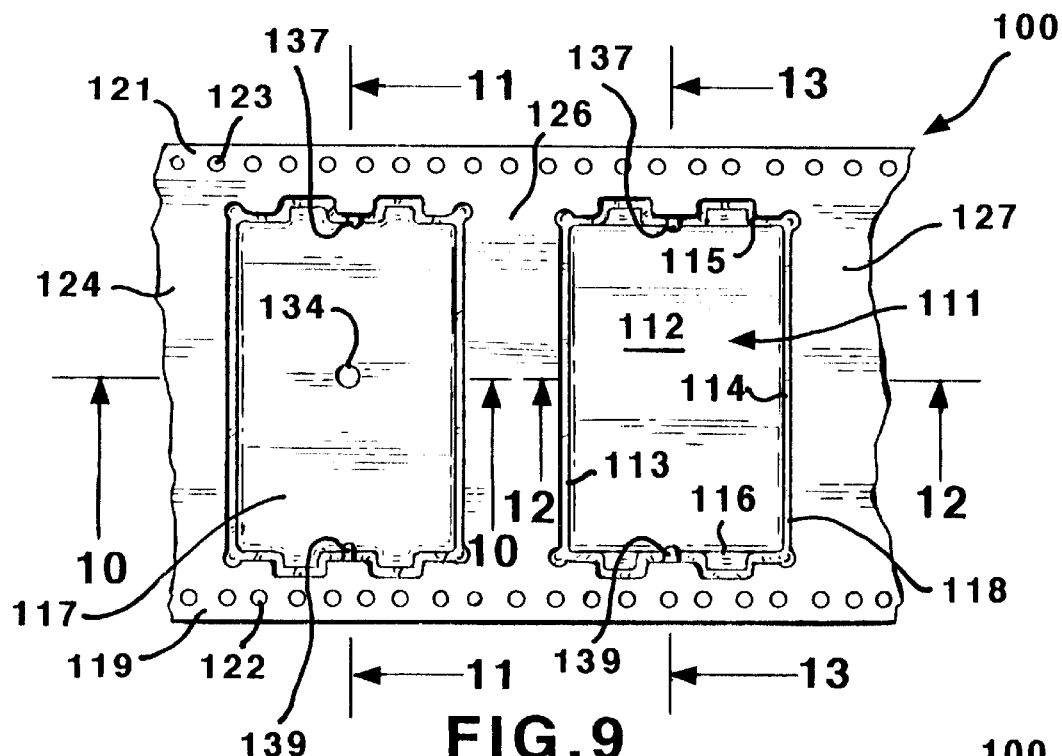
FIG. 9 is a top plan view of a first modification of the component carrier tape of the invention.
Figure 10:
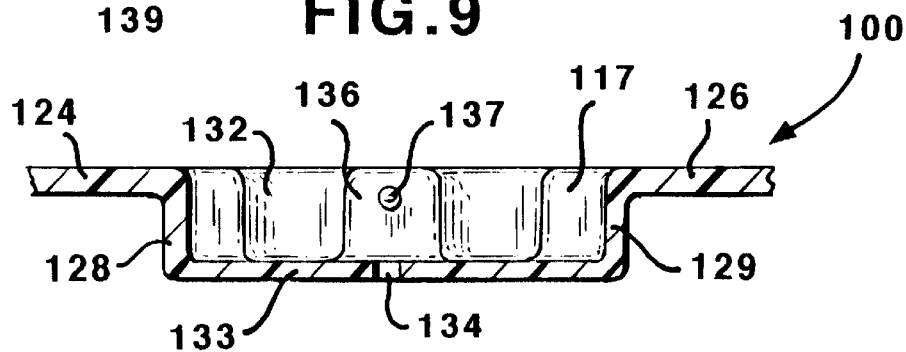
FIG. 10 is an enlarged sectional view taken along line 10—10 of FIG. 9.
Figure 11:
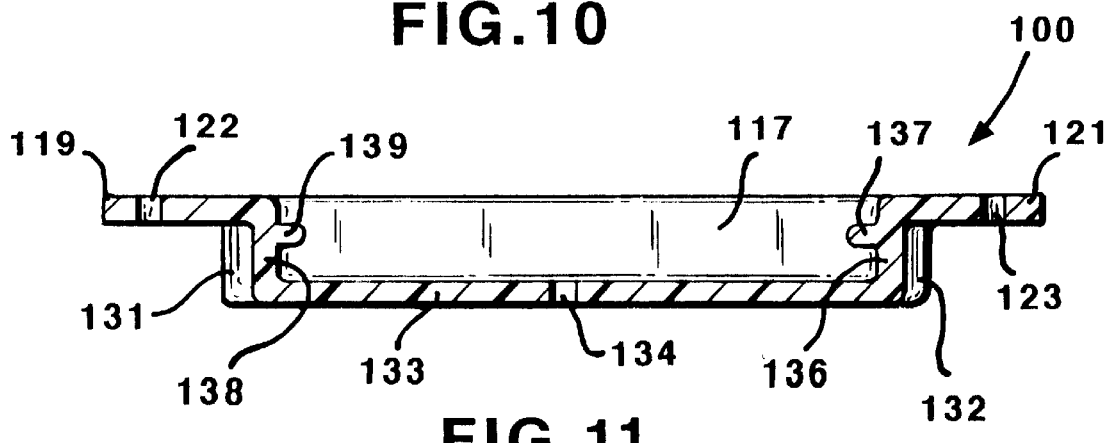
FIG. 11 is an enlarged sectional view taken along line 11—11 of FIG. 9.

The tape 100 has upright transverse side walls 128 and 129 and longitudinal upright end walls 131 and 132. The walls 128, 129, 131 and 132 extended downwardly from flanges 119 and 121 and bridges 126 and 127 are joined to a flat bottom wall 133 to form the pocket for the electronic component. The center of bottom wall has a hole 134 to allow for optical reading with a light beam to determine presence of an electronic component in the pocket As shown in FIGS. 10 and 11 end walls 131 and 132 have inwardly extended upright bosses 136 and 138. Boss 136 has an inwardly directed generally horizontal projection or finger 137 spaced above bottom wall 133. Finger 137 is formed by inwardly deforming a circular portion of boss 136 with movable tooling. Boss 138 has an inwardly directed projection or finger 139 located above bottom wall 133. Fingers 137 and 139, as shown in FIGS. 9 and 11, are located in the same horizontal plane and transversely aligned with each other. Bosses 136 and 139 can have a plurality of inwardly directed fingers engageable with top portions of electronic component 111 to retain the component in pocket 118.

As shown in FIGS. 12 and 13, electronic component 111 located in pocket 118 rests on bottom wall 133. Bottom wall 133 can have platforms to support component 111. Opposite ends of electronic component 111 are located in contiguous relationship with bosses 136 and 138 below fingers 137 and 139 to inhibit lateral movement of electronic component in pocket 118. Fingers 137 and 139 contact opposite top portions of electronic component 111 to restrain vertical movement of electronic component 111 in pocket 118. Fingers 137 and 139 bias electronic component 111 into firm surface engagement with bottom wall 133. The opposite sides of electronic component are in contiguous relationship with tape side walls 128 and 129 to inhibit longitudinal movement of the electronic component 111 in pocket 118. The side walls 128 and 129 and end walls 136 and 138 prevent the electronic component 111 from rotating or twisting in pocket 118.

The electronic component 111 is snapped into pocket 118 over fingers 137 and 139. Bosses 136 and 138 flex outwardly to allow electronic component 111 to pass fingers 137 and 139 and rest on bottom wall 133. The application of downward forces, shown by arrows 141 and 142 in FIG. 13, on flanges 119 and 121 flex bosses 136 and 138 outwardly. As shown in FIG. 14, side wall 132 and boss 136 are flexed outwardly, shown by arrow 144, by application of a force, shown by arrow 142, to remove finger 137 from electronic component 111 and allow electronic component 111 to be moved upwardly as indicated by arrow 146 out of pocket 118.

Figure 15:
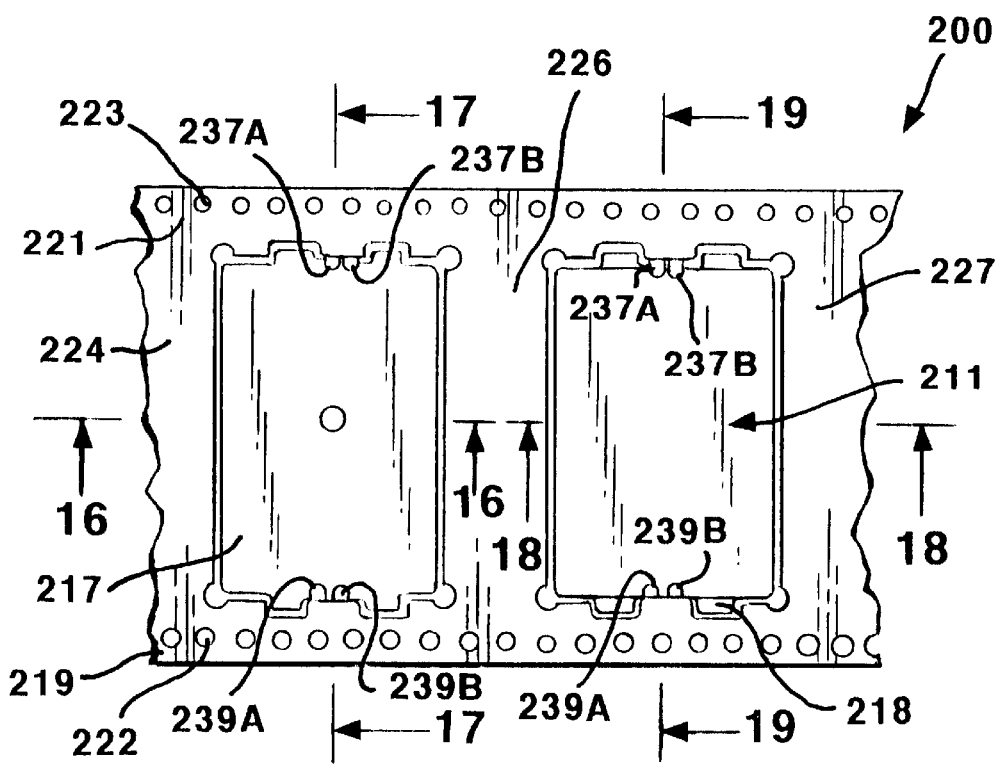
FIG. 15 is a top plan view of a second modification of the component carrier tape of the invention.
Figure 16:
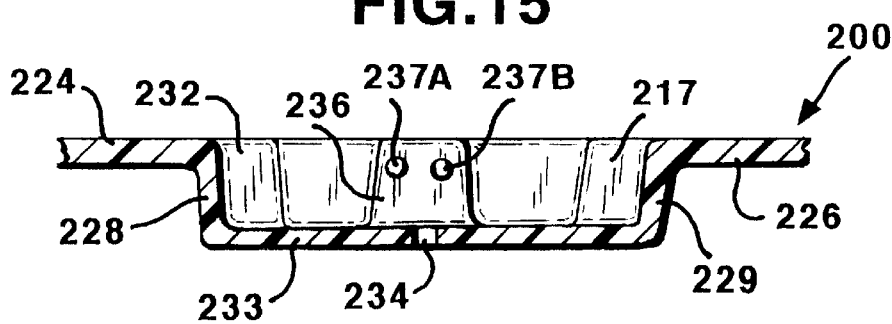
FIG. 16 is an enlarged sectional view taken along line 16—16 of FIG. 15.
Figure 17:
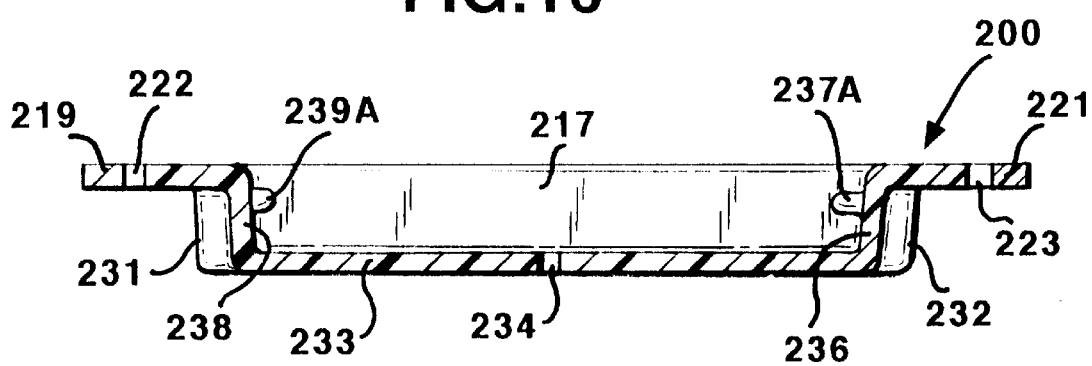
FIG. 17 is an enlarged sectional view taken along line 17—17 of FIG. 15.
Figure 18:
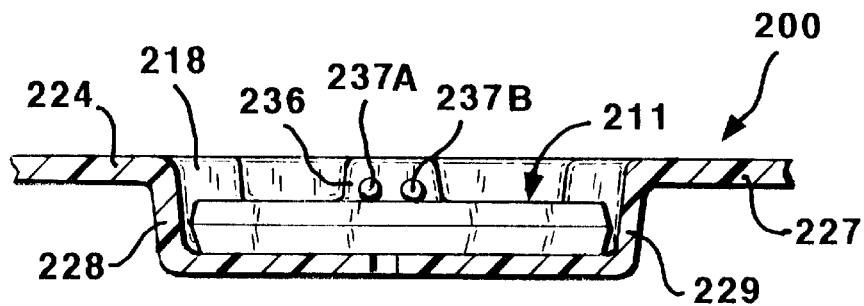
FIG. 18 is an enlarged sectional view taken along line 18—18 of FIG. 15.
Figure 19:
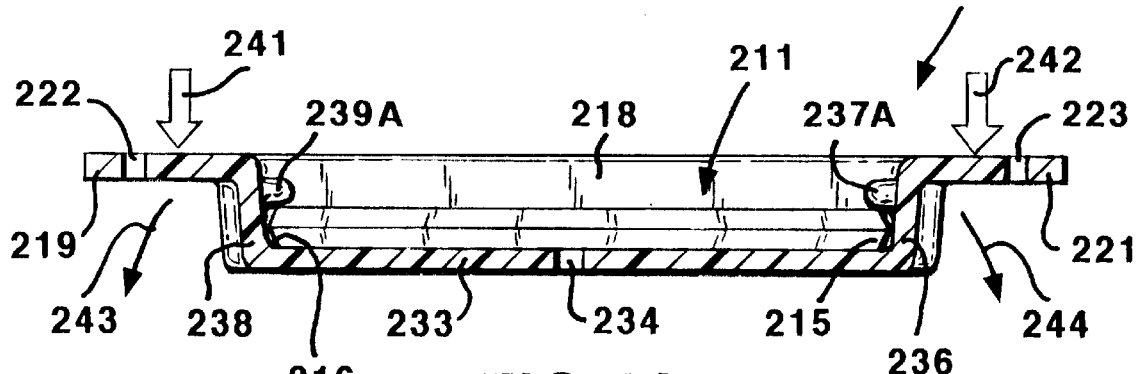
FIG. 19 is an enlarged sectional view taken along line 18—18 of FIG. 15.
Figure 20:
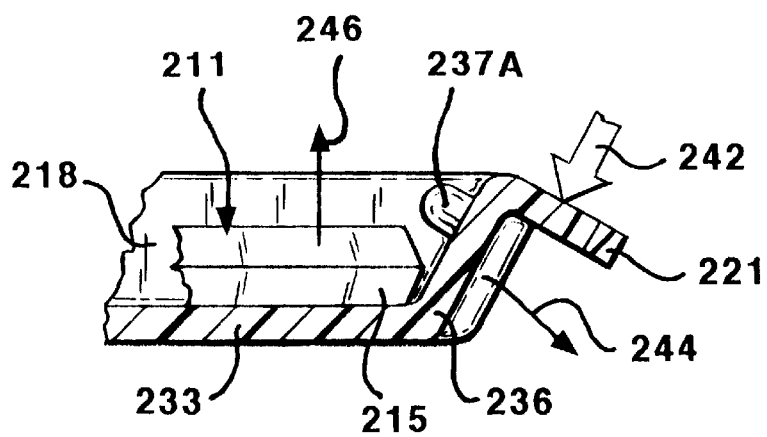
FIG. 20 is an enlarged sectional view of an edge section of the tape of FIG. 15 flexed to the component release position.
Figure 21:
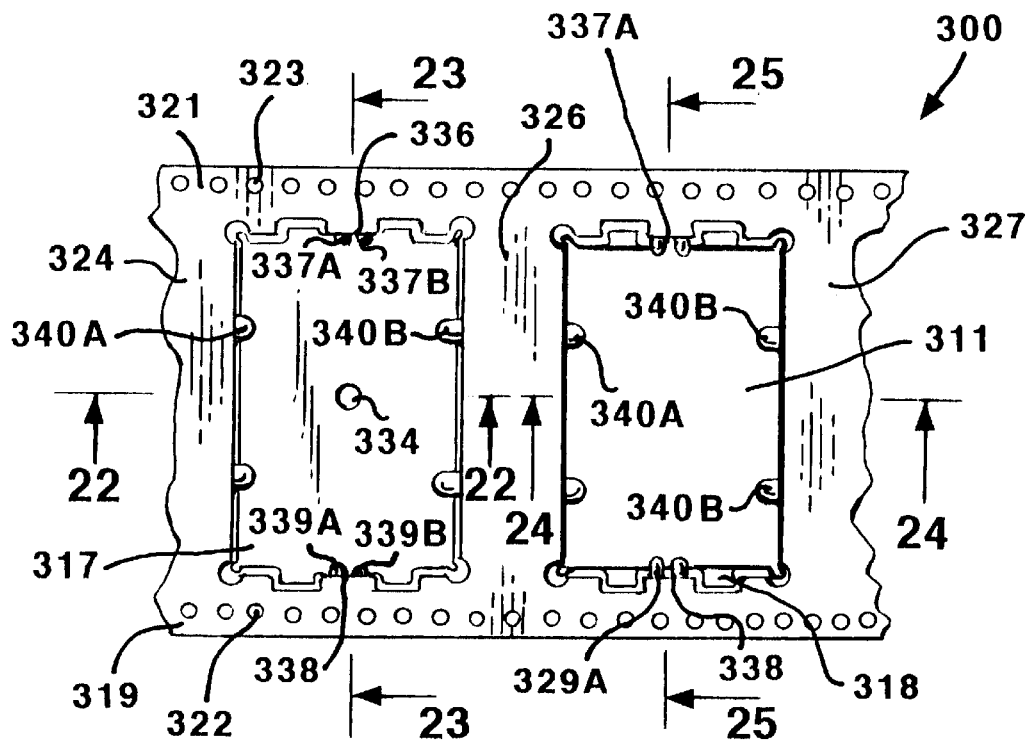
FIG. 21 is a top plan view of a third modification of the component carrier tape of the invention.
Figure 22:
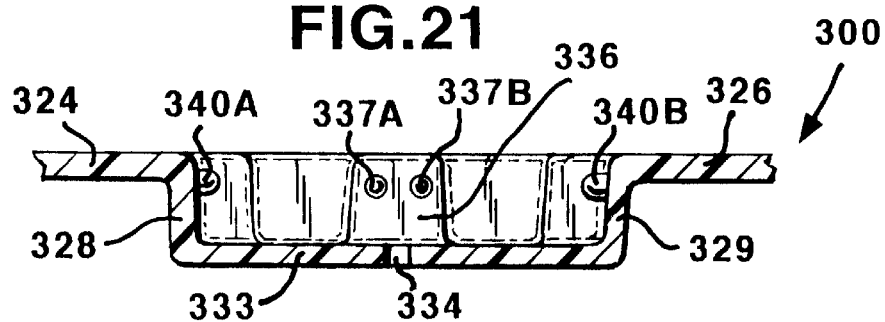
FIG. 22 is an enlarged sectional view taken along line 22—22 of FIG. 21.
Figure 23:
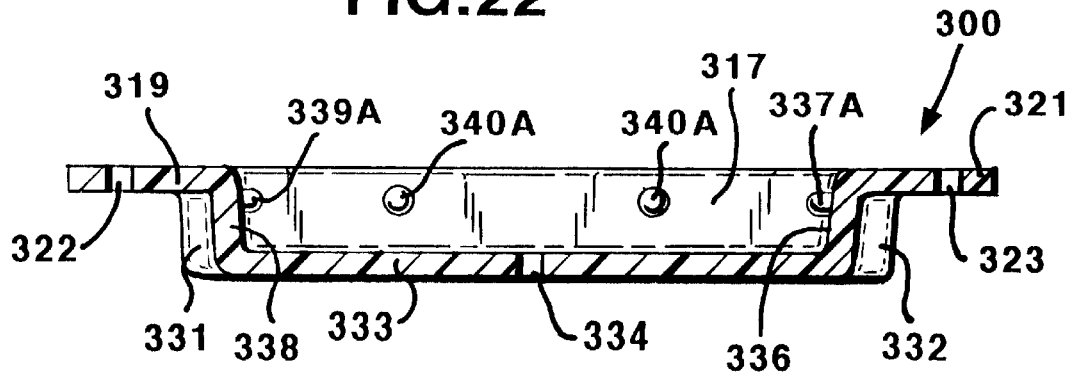
FIG. 23 is an enlarged sectional view taken along line 23—23 of FIG. 21.
Figure 24:
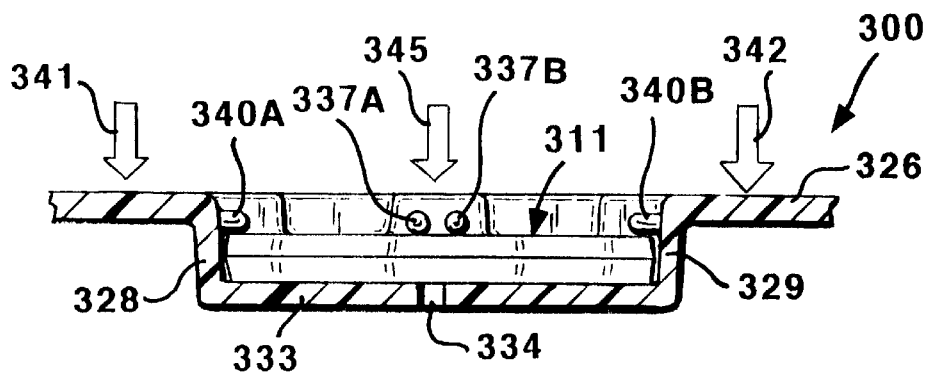
FIG. 24 is an enlarged sectional view taken along line 24—24 of FIG. 21.
Figure 25:
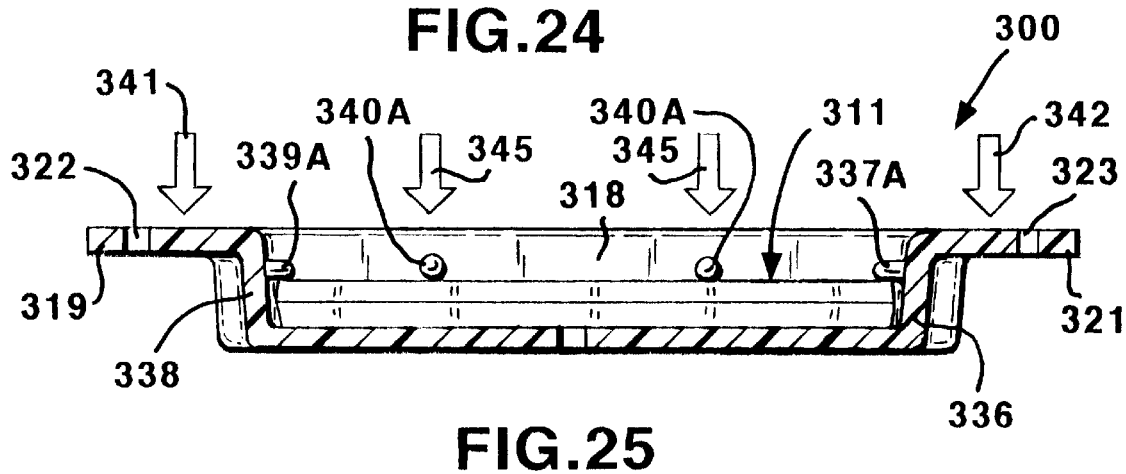
FIG. 25 is an enlarged sectional view taken along line 25—25 of FIG. 21.
Figure 26:
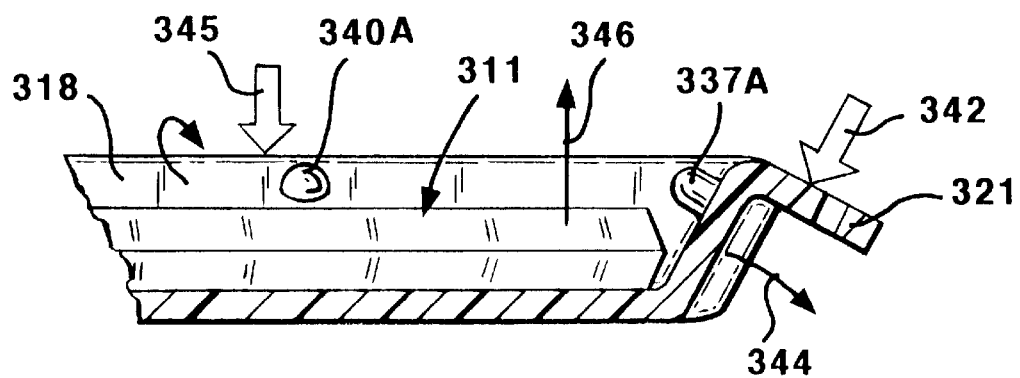
FIG. 26 is an enlarged sectional view showing an edge and a bridge of the tape flexed to the component release position.
Figure 27:
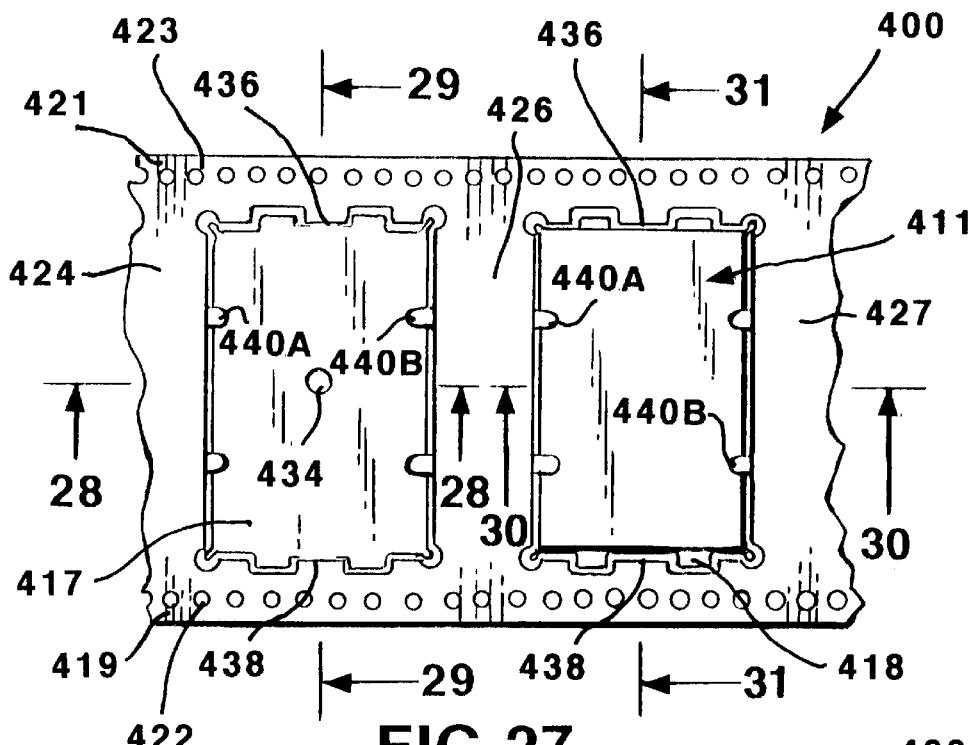
FIG. 27 is a top plan view of a fourth modification of the component carrier tape of the invention.
Figure 28:
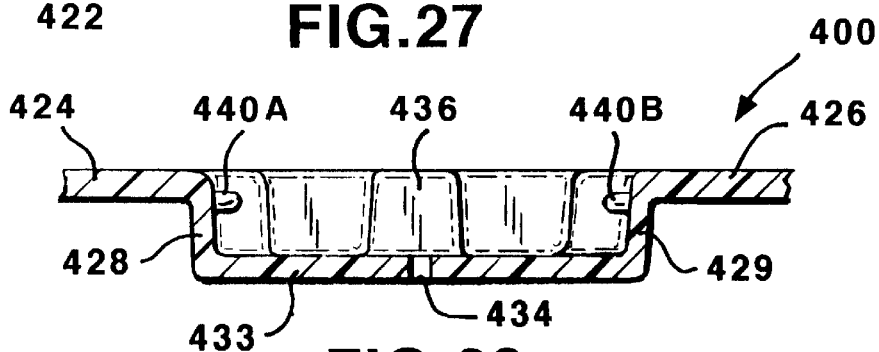
FIG. 28 is an enlarged sectional view taken along line 28—28 of FIG. 27.
Figure 29:
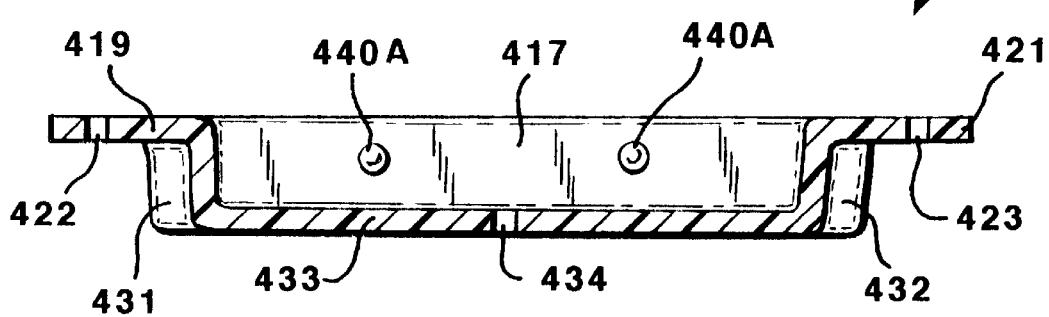
FIG. 29 is an enlarged sectional view taken along line 29—29 of FIG. 27.
Figure 30:
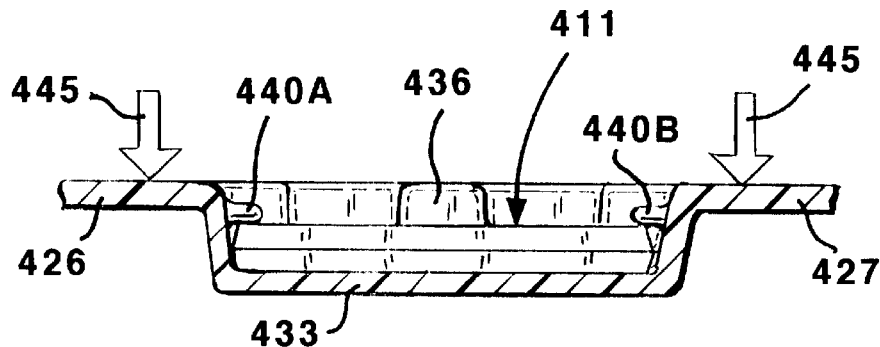
FIG. 30 is an enlarged sectional view taken along the line 30—30 of FIG. 27.
Figure 31:
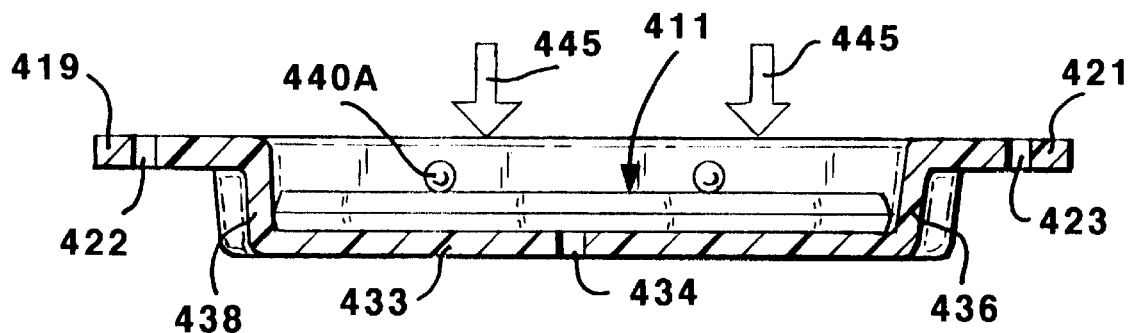
FIG. 31 is an enlarged sectional view taken along line 31—31 of FIG. 27.
Figure 32:
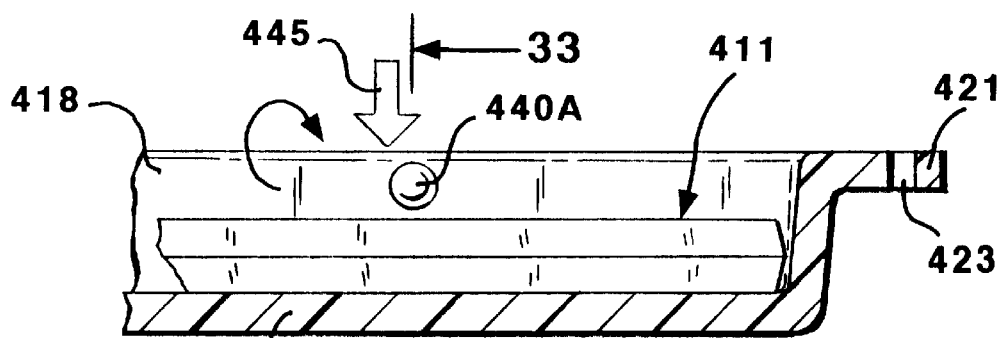
FIG. 32 is an enlarged sectional view of an edge and bridge portion of the tape flexed to the component release position.
Figure 33:
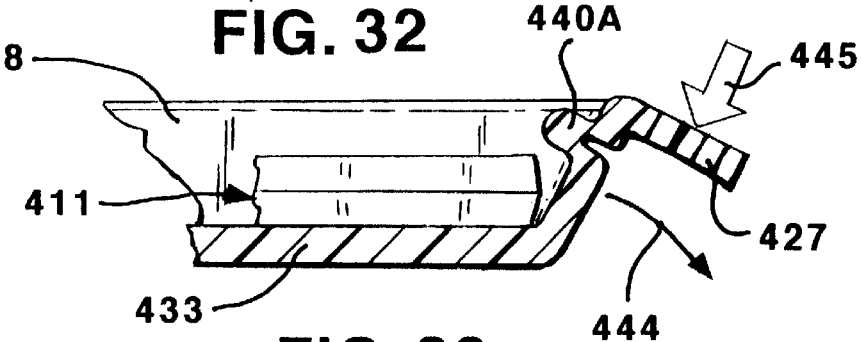
FIG. 33 is a sectional view taken along line 33—33 of FIG. 32.

A second modification of the electronic component carrier tape, indicated generally at 200, is shown in FIGS. 15 to 20. The parts of tape 200 that correspond to the same parts of tape 100 have the prefix 2 in lieu of the prefix 1. As shown in FIGS. 15, 16 and 18, end walls 231 and 232 of pocket 218 have inwardly directed bosses 236 and 238 having generally upright surfaces for transversely positioning electronic component 211 in pocket 218. Bosses 236 and 238 have inwardly directed pairs of fingers 237A, 237B and 239A, 239B that extended over and engage opposite end top portions of electronic component 211. Adjacent fingers 237A, 237B, 239A, and 239B are laterally spaced form each other. The fingers 237A and 237B are projections of the upright wall of boss 236. Fingers 239A and 239B are projection of the upright wall of boss 238. The electronic component 211 is biased into surface engagement with fingers 237A, 237B and 239A and 239B as the distance between the lower portions of the fingers is less than the thickness of the electronic component. The memory characteristics of the plastic of the fingers 237A, 237B and 239A and 239B and bosses 236 and 238 biases the electronic component 111 into firm surface engagement with bottom wall 233, as shown in FIGS. 18 and 19. As shown in FIGS. 19 and 20, forces, shown by arrows 241 and 242, applied to flanges 219 and 221 bend bosses 236 and 238 outwardly to move fingers 237A, 237B and 239A, 239B out of engagement with electronic component 200 thereby allowing the electronic component to be lifted from tape 200.

A third modification of the electronic component carrier tape, indicated generally at 300, is shown in FIGS. 21 to 26. The parts of tape 300 that correspond to the same parts of tapes 100 and 200 have the prefix 3 in lieu of prefixes 1 and 2. The side walls 328 and 329 forming the pocket for the electronic component 311 have inwardly directed fingers or projections 340A and 340B that engage opposite side portions of the top of electronic component 311. Fingers 340A and 340B are two pairs of fingers that bias electronic component 311 along with fingers 337A, 337B and 339A and 339B into firm surface engagement with bottom wall 333. The top of electronic component 311 is below the plane of flanges 319 and 321. Fingers 340A and 340B can be single fingers joined to side walls 328 and 329.

Electronic component 311 is released from tape 300 by applying downward forces on flanges 319 and 321, shown by arrows 341 and 342 and bridges 326 and 327, shown by arrows 345. The tape 300 can be longitudinally curved to release fingers 340A and 340B from electronic component 311.

A fourth modification of the electronic component tape, indicated generally at 400, is shown in FIGS. 27 to 33. The parts of tape 400 that correspond to the parts of tape 100, 200 and 300 have the same reference numbers with the prefix 4 in lieu of the prefixes 1, 2 and 3. Electronic component 411 is retained in pocket 418 with fingers 440A and 440B joined to and extended inwardly from side walls 428 and 429. Fingers 440A and 440B bias electronic component 411 into firm surface engagement with bottom wall 433 and locate the top of electronic component 411 below the horizontal plane of flanges 419 and 421.

Electronic component 411 is released from tape 400 by applying a downward bending force on bridges 426 and 427, shown by arrows 445, or longitudinally bending tape 400. Fingers 440A and 440B are moved away from opposite side of electronic component 411 to allow the component to be lifted out of pocket 418. Bosses 436 and 438 transversely position electronic component 411 in pocket 418. The side walls 428 and 529 longitudinally position electronic component 411 in pocket 418 and prevent twisting of the component 411 in pocket 418.

Although the present invention has been fully described with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A tape for holding electronic components comprising: an elongated strip member having a plurality of longitudinally spaced pockets for holding the electronic components, said strip member having side walls, end walls and a bottom wall joined to said side and end walls forming each pocket, platform means on the bottom wall to locate the electronic component and connector above the bottom wall, boss means on the end walls extended inwardly into the pocket to transversely locate the component in the pocket, and finger means on the boss means engageable with the component to hold the component on the platform means thereby retaining the component in the pocket.

2. The tape of claim 1 wherein: the boss means are located generally on middle portions of the end walls.

3. The tape of claim 2 wherein: the boss means on the end walls are transversely aligned with each other.

4. The tape of claim 1 wherein: the side walls have upright wall portions that engage opposite portions of the component to longitudinally locate the component in the pocket.

5. The tape of claim 1 wherein: the finger means comprise inwardly directed projections of the boss means extendable over top portions of the component to hold the component on the platform means.

6. The tape of claim 1 wherein: the finger means comprise a plurality of inwardly directed projections on each boss means, said projections extendable over top portions of the component to retain the component in the pocket.

7. The tape of claim 1 wherein: the boss means having upright walls below the finger means that contact opposite portions of the component to transversely locate the component in the pocket.

8. The tape of claim 7 wherein: the boss means are located generally on middle portions of the side walls and are transversely aligned with each other.

9. The tape of claim 1 wherein: the side walls have upright wall portions that contact opposite first portions of the component to longitudinally locate the component in the pocket, and the boss means having upright walls below the finger means that contact opposite second portions of the component to transversely locate the component in the pocket.

10. The tape of claim 9 wherein: the finger means comprise inwardly directed projections on the upright walls of the boss means extendable over top portions of the component to hold the component on the platform means.

11. The tape of claim 9 wherein: the boss means are located generally on middle portions of the side walls and are transversely aligned with each other.

12. The tape of claim 1 wherein: one of the side walls have at least one transversely spaced recess for accommodating a portion of the component.

13. The tape of claim 1 wherein: one of the side walls has a plurality of spaced recesses for accommodating portions of different designs of components.

14. A tape for selectively holding electronic components comprising: and elongated strip member having a plurality of longitudinally spaced pockets for holding the electronic components, said strip member having side walls, end walls and a bottom wall joined to said side and end walls forming each pocket, boss means on the end walls extended inwardly into the pocket to transversely locate the component in the pocket, and finger means on the boss means engageable with the component to hold the component in the pocket.

15. The tape of claim 14 wherein: the boss means are located generally on middle portion of the end walls.

16. The tape of claim 15 wherein: the boss means on the end walls are transversely aligned with each other.

17. The tape of claim 14 wherein: the side walls have upright wall portions that engage opposite portions of the component to longitudinally locate the component in the pocket.

18. The tape of claim 14 wherein: the finger means comprise inwardly directed projections of the boss means extendable over top portions of the component to hold the component in the pocket.

19. The tape of claim 14 wherein: the boss means having upright walls below the finger means that contact opposite portions of the component to transversely locate the component in the pocket.

20. The tape of claim 19 wherein: the boss means are located generally on middle portions of the end walls and are transversely aligned with each other.

21. The tape of claim 14 wherein: the side walls have upright wall portions that contact opposite first portions of the component to longitudinally locate the component in the pocket and the boss means having upright walls below the finger means that contact opposite second portions of the component to transversely locate the component in the pocket.

22. The tape of claim 21 wherein: the end walls have upright wall portions that contact opposite first portions of the component to longitudinally locate the component in the pocket and the boss means having upright walls below the finger means that contact opposite second portions of the component to transversely locate the component in the pocket.

23. The tape of claim 21 wherein: each of the electronic components have a connector with leads offset from the center of one side edge of the component, and one of said end walls of the strip member having a pair of transversely spaced recesses for accommodating the connector whereby when the component is in one position the connection is located in one recess and when the component is in the other position opposite the one position the component is located in the other recess.

24. The tape of claim 28 wherein: the finger means comprise inwardly directed projections on the upright walls of the boss means extendable over top portions of the component to hold the component in the pocket.

25. The tape of claim 24 wherein: the boss means are located generally on middle portions of the side walls and are transversely aligned with each other.

26. The tape of claim 24 wherein: the finger means comprise a plurality of inwardly directed projections extendable over top portion of the component to retain the component in the pocket.

27. The tape of claim 24 including: second finger means on the side walls extendable over second top portions of the component cooperating with the finger means on the boss means to hold the component in the pocket.

28. The tape of claim 27 wherein: the finger means on the boss means and second finger means each have a plurality of inwardly directed projections extendable over top portions of the component to retain the component in the pocket.

29. The tape of claim 14 wherein: one of the side walls has at least one transversely spaced recess for accommodating a portion of the component.

30. A tape for selectively holding electronic components comprising: an elongated strip member having a plurality of longitudinally spaced pockets for holding the electronic components, said strip having side walls, end walls and a bottom wall joined to said side and end walls forming each pocket, means on the end walls to transversely locate the component in the pocket, and finger means on the side walls engageable with the component to hold the component in the pocket.

31. The tape of claim 30 wherein: the side walls have upright wall portions that engage opposite portions of the component to longitudinally locate the component in the pocket.

32. The tape of claim 30 wherein: the finger means comprise inwardly directed projections of the side walls extendable over top portions of the component to hold the component in the pocket.

33. The tape of claim 30 wherein: the side walls having upright walls below the finger means that contact opposite portions of the component to longitudinally locate the component in the pocket.

34. The tape of claim 30 wherein: the finger means include a plurality of inwardly directed projections on each side wall extendable over top portions of the component to hold the component in the pocket.

35. The tape of claim 30 including: second finger means on the end walls extended over second top portions of the component cooperating with the finger means on the side walls to hold the component in the pocket.

36. The tape of claim 35 wherein: the second finger means includes a plurality of inwardly directed projections on each end wall extended over the second top portions of the component.

37. The tape of claim 35 wherein: the finger means include a plurality of inwardly directed first projections on each side wall and second finger means having inwardly directed second projections on each end wall, said first and second projections extendable over separate portion of the top of the component to hold the component in the pocket.

38. The tape of claim 30 wherein: the finger means comprise inwardly directed projections on the upright walls of the boss means extendable over top portions of the component to hold the component in the pocket.

39. The tape of claim 30 wherein: the boss means are located generally on middle portions of the side walls and are transversely aligned with each other.

* * * * *